United States Patent [19]

Tanaka et al.

[11] 3,767,415

[45] Oct. 23, 1973

[54] PHOTOSENSITIVE COMPOSITION COMPRISING LIGHT-SENSITIVE POLYMER

[75] Inventors: Hideaki Tanaka, Hiratsuka; Minoru Tsuda, Kanagawa, both of Japan

[73] Assignee: Agency of Industrial Science & Technology, Tokyo, Japan

[22] Filed: Nov. 11, 1971

[21] Appl. No.: 197,755

[30] Foreign Application Priority Data

Nov. 14, 1970 Japan .................................. 45/99826

[52] U.S. Cl. ............ 96/115 R, 96/35.1, 204/159.14

[51] Int. Cl. ................................................ G03c 1/68

[58] Field of Search .......................... 96/115 R, 35.1; 204/159.14

[56] References Cited

UNITED STATES PATENTS 3,257,664 6/1966 Leubner et al. .................... 96/115 R 3,635,720 1/1972 Steppan et al. .................... 96/115.9

*Primary Examiner*—Ronald H. Smith

*Attorney*—Kurt Kelman

[57] ABSTRACT

This invention is concerned with a photosensitive composition having, as a pendant, α-phenyl cinnamylidene acetyl group of the generic formula:

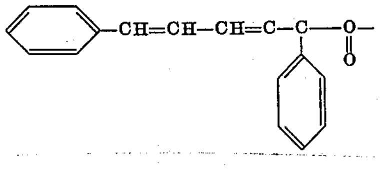

1 Claim, 4 Drawing Figures

PHOTOSENSITIVE COMPOSITION COMPRISING LIGHT-SENSITIVE POLYMER

This invention relates to a novel photosensitive composition.

Poly(vinyl cinnamate) has been known to form an excellent photosensitive resin and is now used extensively in printing, in manufacture of integrated circuits, etc. The ultraviolet absorption spectrum of poly(vinyl cinnamate) has its absorption peak at 275 mμ. Thus, this polymer does not absorb rays of wavelengths exceeding 340 mμ. Addition of a sensitizer is required, therefore, where the poly(vinyl cinnamate) resin is desired to be rendered sensitive to rays of near-ultraviolet wavelengths. Even when the sensitizer is added, the resin fails to provide very satisfactory photo sensitivity to rays having wavelengths exceeding 400 mμ. Nevertheless, poly(vinyl cinnamate) is used extensively in many fields because of its superiority in thermal stability, storageability, etc.

As one of the photosensitive resins sensitive to longer wavelengths, there has heretofore been known poly(vinyl cinnamylidene acetate) (hereinafter abbreviated as "PVCA") (U.S. Pat. No. 3,257,664). PVCA, upon incorporation therein of a sensitizer, acquires improved photosensitivity even in the wavelength zone of visible rays but suffers from very inferior thermal stability and storageability. When such PVCA is put to storage for a long time, it gradually undergoes gelation and eventually becomes unusable. If it is held at a temperature higher than normal room temperature, then it rapidly induces cross-linking reaction and is converted into a gel. Despite a higher photosensitivity than that of poly(vinyl cinnamate), PVCA finds a rather restricted field of uses because it is difficult to handle.

It is the main object of this invention of provide a photosensitive composition highly sensitive to visible rays and stable thermally. Since the photosensitive composition according to the present invention has sufficient sensitivity also to visible rays, it does not require the use of an expensive optical system incorporating a xenon lamp, mercury bulb, or quartz lens for the purpose of exposure. Satisfactory exposure can be accomplished by an optical system using a tungsten lamp as the light source. Further, the present photosensitive composition enables the exposure to be made by means of projection which permits a given image to be enlarged or contracted as desired. In the manufacture of integrated circuits, for example, the image of a desired circuit can be projected on this resin without damaging the mask. Thus, handling can be made easier and more economical.

Figures 1A, 1B, 2A, 2B:
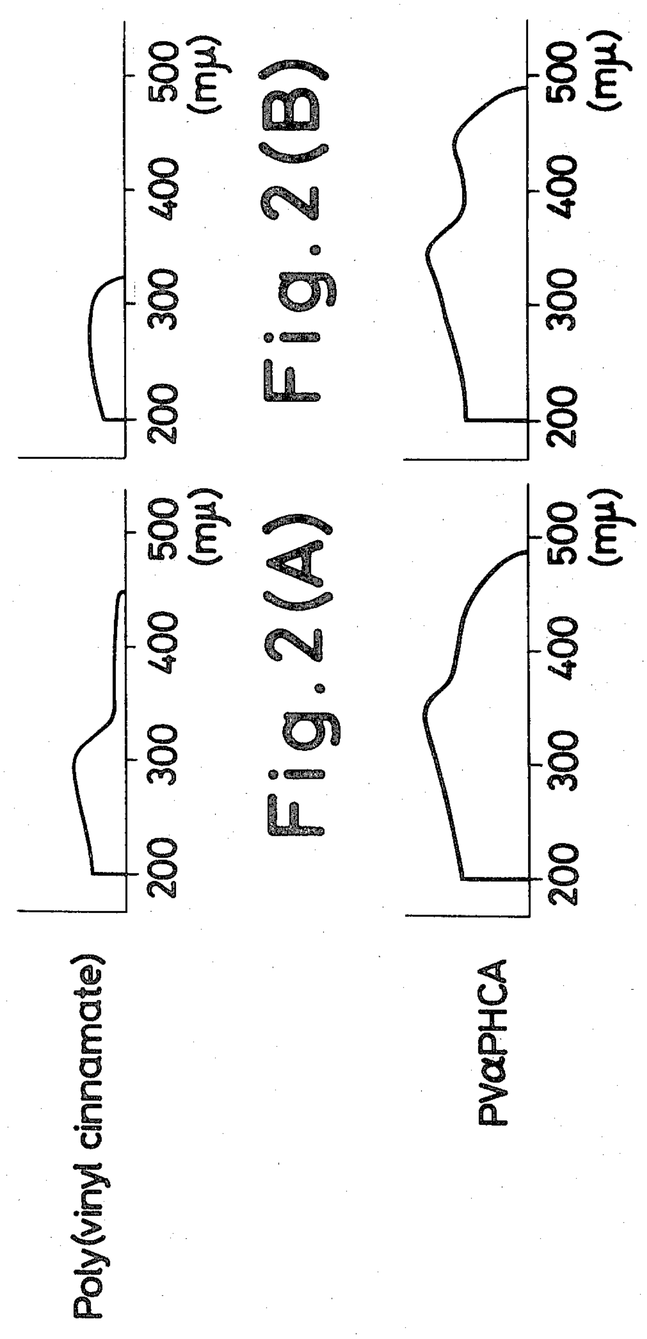
FIG. 1 shows the spectrograms obtained for poly(vinyl cinnamate) sensitized by 1,2-benzanthraquinone and 9,10-phenanthroquinone respectively.
FIG. 2 shows the spctrograms obtained for the photosensitive composition of the present invention sensitized by 1,2-benzanthraquinone and 9,10-phenanthroquinone respectively.

The inventors commenced studies with a view to improving the thermal stability and storageability of "PVCA" mentioned above. In the course of their studies, they foresaw possibility of PVCA by attaching a phenyl group to the alpha position of the photosensitive group "cinnamylidene acetyl" thereby allowing the photosensitive group to acquire the diphenyl butadiene configuration. Contrary to what was expected, this diphenyl butadiene carboxylic acid (α-phenyl cinnamylidene acetic acid) did not induce any photodimerization of molecules at all, while cinnamylidene acetic acid was found to be photodimerizable. For the purpose of obtaining a photosensitive resin having satisfactory thermal stability, the inventors made attempts to convert this diphenyl butadiene carboxylic acid, a substance totally destitute of photosensitivity, into a photosensitive resin. Fortunately, a high molecular compound "polyvinyl-α-phenyl cinnamylidene acetate" (hereinafter abbreviated as "PVαPhCA") was able to be synthesized by having diphenyl butadiene carboxylic acid bonded to the main chain of polymer and the resultant compound was found to be a photosensitive composition having substantially the same degree of sensitivity as PVCA and much higher degree of thermal stability than PVCA.

When PVCA was heated at about 120°C for about one hour, it became unusuable because more than 20% of its photosensitive group was decomposed and consequently cross-linked. By contrast, PVαPhCA of the present invention remained virtually unaffected under the same conditions. When this polymer was finely divided into a powdery state and then exposed in the air for more than one year, it also remained virtually unaltered. When the phenyl group was attached to the alpha position of cinnamylidene acetyl, the polymer showed thermal stability higher than that of the polymer having some other group, such as alkyl group or cyano group, attached to the said position. This may logically be explained by postulating that the diphenyl butadiene configuration provided the desired stability as expected.

The photosensitive high molecular compound having α-phenyl cinnamylidene acetyl as its photosensitive group can be produced by esterifying a high molecular polyvinyl alcohol type polymer with α-phenyl cinnamylidene acetate. Consequently, there is obtained a polymer of the following structural formula:

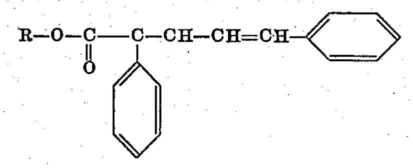

(wherein, R denotes a high molecular vinyl alcohol type polymer).

PVαPhCA thus obtained has the peak of its ultraviolet absorption spectrum at 333 mμ, a value substantially the same as that of the peak of diphenyl butadiene, and can absorb rays of wavelengths up to about 440 mμ. This means that this compound has a photosensitivity wavelenght zone up to 440 mμ without requiring the incorporation of any sensitizer. This sensitive wavelength zone is substantially equivalent to the wavelength zone enjoyed by poly(vinyl cinnamate) using a sensitizer.

PVαPhCA may have its photosensitivity further enhanced by incorporating a sensitizer. For this purpose, the sensitizers which are used for enhancing the photosensitivity of poly(vinyl cinnamate) are invariably available. The incorporation of such sensitizer has a greater effect in this compound than in poly(vinyl cinnamate).

5-Nitroacenaphthene enhances the sensitivity of poly(vinyl cinnamate) to 440 mμ and that of PVαPhCA to about 480 mμ. 1,2-Benzanthraquinone increases the sensitivity of poly(vinyl cinnamate) to 430 mμ and that of PVαPhCA to 500 mμ. The sensitivity of PVαPhCA can be enhanced up to about 560 mμ by such xanthene dyes as eosine, erythrosine, and rose bengal. These coloring matters enhance the sensitivity of PVαPhCA to visible rays. Consequently, PVαPhCA with enhanced sensitivity enables the exposure by enlarged projection to be effected with a tungsten lamp. In the manufacture of integrated circuits, it is strongly desired to increase the sensitivity enough to respond to rays of mercury lamp having a wavelength of 436 mμ but not so much as to respnd to visible rays having wavelengths exceeding 500 mμ. This object is attained by using PVαPhCA suitably incorporating such sensitizer. PVαPhCA not only enjoys excellent thermal stability but also possesses high photosensitivity. Moreover, the zone of photosensitive wavelengths can be freely regulated over the near-ultraviolet band through the visible band. Thus, PVαPhCA is expected to find a wide range of uses.

Now, preferred embodiments of this invention are described. They are cited for the purpose of illustration and should not be construed as limiting the present invention in any way.

EXAMPLE 1

With 40 ml of triethylamine and 80 ml of acetic anhydride, 52.9 g of cinnamaldehyde and 55 g of phenylacetic acid were heated at 130° C for about 5 hours to afford 84 g of α-phenyl cinnamylidene acetic acid (yield 84 percent). α-Phenyl cinnamylidene acetyl chloride was produced by agitating 15 g of this phenyl cinnamylidene acetic acid, 15 ml of thionyl chloride and 15 ml of toluene at 70° C for 1 hour and, subsequent to the ensuing reaction, removing excess thionyl chloride by distillation. This chloride was combined with 2.6 g of polyvinyl alcohol and 50 ml of pyridine and agitated at 50° C for about 5 hours. On completion of the reaction, the reaction system was placed in a large volume of alcohol, with the result that there was produced a brown polymer. This polymer was dissolved in cychohexanone to form a photosensitive liquid. This photosensitive liquid was spread on a dry-plate glass and dried, and exposed through Kodak Step Table No. 2 to a superhigh-pressure mercury lamp (Model SHL-10-0UV made by Toshiba) placed at a distance of 25 cm. The sensitivity was equal to that produced by poly(vinyl cinnamate) which was sensitized with 5-nitroacenaphthene or N-acetyl-4-nitro-1-naphthylamine.

The sensitivity of the polymer was measured spectroscopically by using a xenon lamp as the light source. The results indicate that the sensitivity ranged in wavelength between 200 mμ and 450 mμ and that the maximum sensitivity existed around 350 mμ.

EXAMPLE 2

Fifteen g of α-phenyl cinnamylidene acetyl chloride was dissolved in 70 ml of methylethyl ketone and kept at about −5° C. With the aqueous solution of polyvinyl alcohol (2.6g/50ml), 8g/50ml of sodium hydroxide and 70 ml of methylethyl ketone were mixed. The mixture was combined with the acid chloride solution prepared in advance and then agitated at −5° C for about 90 minutes. Thereafter, the reaction solution was allowed to stand at normal room temperature. The polymer formed in the upper layer was dissolved in cyclohexanone to form a photosensitive liquid.

The results of the sensitivity measurement indicate that this polymer showed essentially the same degree of sensitivity as that of the polymer of Example I.

EXAMPLE 3

Polyvinyl-α-phenyl cinnamylidene acetate synthesized by the procedure of Example 1 was processed to form its 2.5 percent cyclohexanone solution. Photosensitive liquids were prepared by adding sensitizers indicated below to this solution each in an amount corresponding to 20 percent of the weight of polymer. The photosensitive liquids were spread on quartz glass plates, dried and then measured for their sensitivity spectroscopically by means of a spectroscopic sensitivity tester provided with a 2-KW xenon lamp and a spectroscope. The development was made in tetrahydrofuran. The results are shown in Table 1.

TABLE 1

| Name of sensitizer | Photosensitive wavelength zone |
|---|---|
| 5-Nitroacenaphthene | 200 mμ to 480 mμ |
| Eosine | 200 mμ to 560 mμ |
| Erythrosin | Do. |
| Rose bengal | 200 mμ to 600 mμ |
| Thio-Michler's ketone | 200 mμ to 620 mμ |

EXAMPLE 4

Photosensitive liquids were prepared by adding 1,2-benzanthraquinone and 9,10-phenanthroquinone, each in an amount of 5 percent based on the weight of polymer, to 2.5 percent cyclohexanone solutions of poly(vinyl cinnamate) and PVαPhCA. The photosensitive liquids were spread on quartz glass plates, dried, and thereafter measured for sensitivity spectroscopically by means of a spectroscopic sensitivity tester provided with a 2-KW xenone lamp and a spectroscope. The development was effected by submerging the film for two minutes in methylethyl ketone in the poly(vinyl cinnamate) and in tetrahydrofuran in the case of PVαPhCA respectively.

The results are shown in FIG. 1 wherein FIG. 1 (A) and FIG. 1 (B) show the spectrographs for cyclohexanone solution of poly(vinyl cinnamate) sensitized by 1,2-benzanthraquinone and 9,10-phenanthroquinone respectively and FIG. 2 (A) and FIG. 2 (B) show the spectrographs for PVαPhCA sensitized by 1,2-benzanthraquinone and 9,10-phenanthroquinone respectively.

It is clear from FIG. 1 that PVαPhCA films sensitized with the sensitizers were conspicuously sensitive in the range of 400 mμ to 500 mμ. These films lacked photosensitivity at wavelengths beyond 500 mμ and, therefore, could be handled safely under rays from a yellow darkroom lamp. The films of poly(vinyl cinnamate) has very weak sensitivity beyond 400 mμ. Thus, they could not practically be used in wavelengths beyond this level. Example 5:

PVαPhCA, PVCA, poly(vinyl α-methylcinnamylidene acetate) and poly (vinyl cinnamate) each prepared in the form of 2.5 percent cyclohexanone solution were spread on quartz glass plates and then dried at room temperature under a reduced pressure to form test films. The test films were kept in an oven at 120° C for 1 hour. Ultraviolet absorption spectra were obtained of these films before and after the heating in the oven, to compute the ratio of thermal reaction of their photosensitive groups. The results are shown below.

| Photosensitive resin | PVαPhCA | PVCA | PV α-methyl cinnamylidene acetate | Poly(vinylcinnamate) |
|---|---|---|---|---|
| Ratio of thermal decomposition | <1% | 23% | 40% | <1% |

What is claimed is:

1. A photosensitive composition comprising a photosensitive vinyl alcohol type polymer having, as its pendant, α-phenyl cinnamylidene acetyl group of the generic formula:

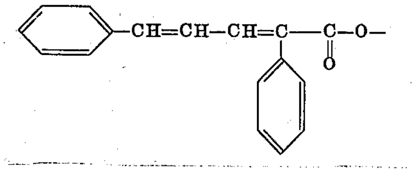

* * * * *